(12) United States Patent
Li et al.

(10) Patent No.: US 10,008,537 B2
(45) Date of Patent: Jun. 26, 2018

(54) COMPLEMENTARY MAGNETIC TUNNEL JUNCTION (MTJ) BIT CELL WITH SHARED BIT LINE

(71) Applicant: QUALCOMM Incorporated, San Diego, CA (US)

(72) Inventors: Xia Li, San Diego, CA (US); Xiaochun Zhu, San Diego, CA (US); Yu Lu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 221 days.

(21) Appl. No.: 14/744,984

(22) Filed: Jun. 19, 2015

(65) Prior Publication Data

US 2016/0372518 A1   Dec. 22, 2016

(51) Int. Cl.

| | |
|---|---|
| *G11C 11/15* | (2006.01) |
| *H01L 27/22* | (2006.01) |
| *H01L 43/02* | (2006.01) |
| *H01L 43/08* | (2006.01) |
| *G11C 11/16* | (2006.01) |
| *H01L 43/12* | (2006.01) |

(52) U.S. Cl.
CPC .......... *H01L 27/226* (2013.01); *G11C 11/161* (2013.01); *G11C 11/1655* (2013.01); *G11C 11/1659* (2013.01); *G11C 11/1673* (2013.01); *G11C 11/1675* (2013.01); *H01L 27/22* (2013.01); *H01L 43/02* (2013.01); *H01L 43/08* (2013.01); *H01L 43/12* (2013.01)

(58) Field of Classification Search
CPC ..... G11C 11/15; G11C 11/16; G11C 11/1659; G11C 11/1673; G11C 11/1675; G11C 7/18

See application file for complete search history.

(56) References Cited

U.S. PATENT DOCUMENTS

| 6,958,502 | B2 | 10/2005 | Lu | |
|---|---|---|---|---|
| 7,245,522 | B2 * | 7/2007 | Aoki | ....................... G11C 11/16 365/158 |
| 7,376,006 | B2 | 5/2008 | Bednorz et al. | |
| 7,881,098 | B2 * | 2/2011 | Xi | ........................... G11C 11/16 365/148 |
| 7,885,095 | B2 | 2/2011 | Sakimura et al. | |
| 7,940,548 | B2 * | 5/2011 | Wang | ...................... G11C 7/18 365/100 |
| 8,654,577 | B2 | 2/2014 | Yang et al. | |
| 2002/0006058 | A1 * | 1/2002 | Nakajima | ............... G11C 11/16 365/171 |
| 2005/0087785 | A1 | 4/2005 | Lu | |
| 2008/0043514 | A1 | 2/2008 | Ueda | |
| 2010/0054026 | A1 | 3/2010 | Xi et al. | |

OTHER PUBLICATIONS

International Search Report and Written Opinion—PCT/US2016/033799—ISA/EPO—dated Aug. 26, 2016.

* cited by examiner

*Primary Examiner* — Andrew Q Tran (74) *Attorney, Agent, or Firm* — Toler Law Group, PC.

(57) ABSTRACT

A complementary bit cell includes a first magnetic tunnel junction (MTJ) device having a free layer coupled to a first access transistor and having a pinned layer coupled to a bit line. The complementary bit cell also includes a second MTJ device having a free layer coupled to the same bit line and having a pinned layer coupled to a second access transistor.

16 Claims, 9 Drawing Sheets

COMPLEMENTARY MAGNETIC TUNNEL JUNCTION (MTJ) BIT CELL WITH SHARED BIT LINE

I. FIELD

The present disclosure is generally related to a bit cell.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), tablet computers, and paging devices that are small, lightweight, and easily carried by users. Many such computing devices include other devices that are incorporated therein. For example, a wireless telephone can also include a digital still camera, a digital video camera, a digital recorder, and an audio file player. Also, such computing devices can process executable instructions, including software applications, such as a web browser application that can be used to access the Internet and multimedia applications that utilize a still or video camera and provide multimedia playback functionality.

A wireless device may include one or more memory devices to store data. A memory device may include a complementary bit cell having two transistors and two magnetic tunnel junction (MTJ) devices (e.g., a "2T2MTJ" bit cell). Typically, the complementary bit cell includes two bit lines and two source lines. For example, the complementary bit cell may include a first access transistor coupled to a first source line, a first MTJ device coupled to a first bit line, a second access transistor coupled to a second source line (e.g., a source line having an "opposite" potential as the first source line), and a second MTJ device coupled to a second bit line (e.g., a bit line having an "opposite" potential as the first bit line). As a result, the complementary bit cell may require a relatively large area (e.g., routing area) to accommodate using two bit lines (e.g., the first bit line and the second bit line (or bit line "bar")).

III. SUMMARY

Techniques for forming a complementary bit cell having a shared bit line are disclosed. The complementary bit cell may include two magnetic tunnel junction (MTJ) devices coupled to a common bit line. For example, a pinned layer of a first MTJ device may be coupled to the bit line and a free layer of a second MTJ device may be coupled to the bit line. Coupling the pinned layer of the first MTJ device to the bit line may be referred to as a "normal connection" and coupling the free layer of the second MTJ device to the bit line may be referred to as a "reverse connection". Utilizing the common bit line reduces a routing area of the complementary bit cell and reduces the amount of metal traces (e.g., reduce a metal trace associated with a bit line "bar") compared to a traditional 2T2MTJ complementary bit cell.

In a particular aspect, a complementary bit cell includes a first magnetic tunnel junction (MTJ) device having a free layer coupled to a first access transistor and having a pinned layer coupled to a bit line. The complementary bit cell also includes a second MTJ device having a free layer coupled to the bit line and having a pinned layer coupled to a second access transistor.

In another particular aspect, a method for forming a complementary bit cell includes coupling a free layer of a first magnetic tunnel junction (MTJ) device to a first access transistor and coupling a pinned layer of the first MTJ device to a bit line. The method also includes coupling a free layer of a second MTJ device to the bit line and coupling a pinned layer of the second MTJ device to a second access transistor.

In another particular aspect, a non-transitory computer-readable medium includes data enabling for enabling fabrication equipment to form a complementary bit cell. The data, when used by fabrication equipment, causes the fabrication equipment to couple of a free layer of a first magnetic tunnel junction (MTJ) device to a first access transistor and couple of a pinned layer of the first MTJ device to a bit line. The data also causes the fabrication equipment to couple of a free layer of a second MTJ device to the bit line and couple of a pinned layer of the second MTJ device to a second access transistor.

In another particular aspect, a complementary bit cell includes first means for storing a first data value, the first means for storing having a first free layer coupled to a first access transistor and having a first pinned layer coupled to a bit line. The complementary bit cell also includes second means for storing a second data value, the second means for storing having a second free layer coupled to the bit line and having a second pinned layer coupled to a second access transistor.

One particular advantage provided by at least one of the disclosed aspects is a reduced routing area in a complementary bit cell and a reduced amount of metal traces compared to a traditional 2T2MTJ complementary bit cell. Other aspects, advantages, and features of the present disclosure will become apparent after review of the entire application, including the following sections: Brief Description of the Drawings, Detailed Description, and the Claims.

V. DETAILED DESCRIPTION

Figure 1:
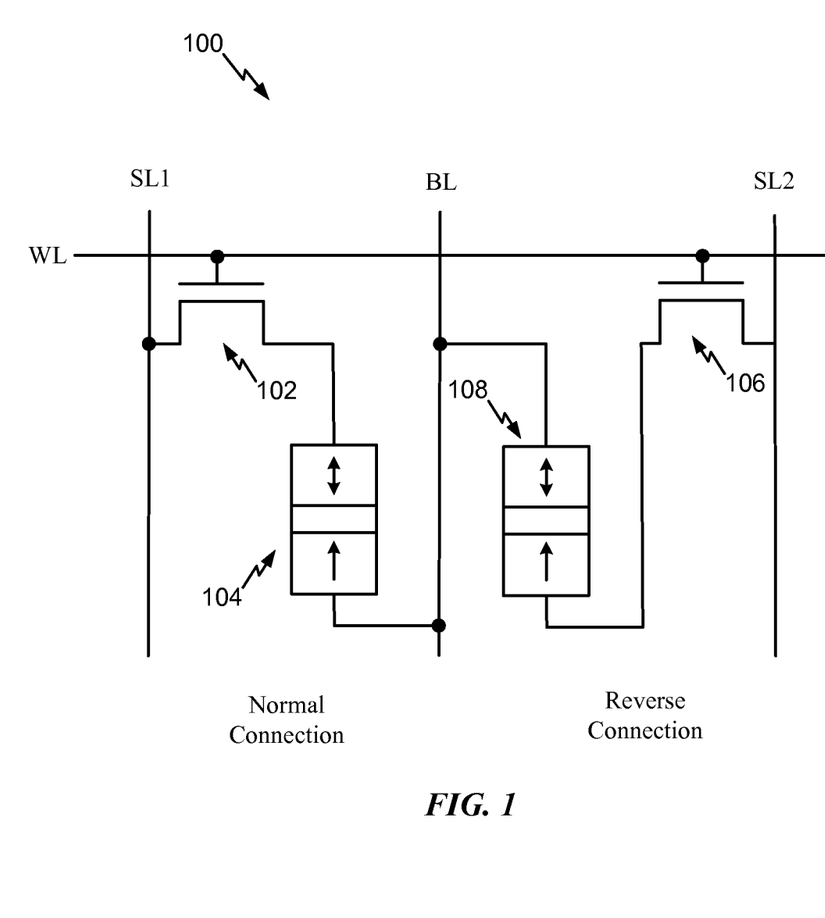
FIG. 1 is a diagram of a particular illustrative aspect of a complementary bit cell having a shared bit line.

Referring to FIG. 1, a particular illustrative aspect of a complementary bit cell 100 having a shared bit line is shown. The complementary bit cell 100 includes a first access transistor 102, a first magnetic tunnel junction (MTJ) device 104, a second access transistor 106, and a second MTJ device 108. The illustrated complementary bit cell 100 is a two transistor-two MTJ bit cell (e.g., a "2T2MTJ" bit cell). In a particular aspect, the complementary bit cell 100 may be included in a spin-transfer torque magnetic random access memory (STT-MRAM) device or STT-MRAM array. The STT-MRAM device may be integrated in a mobile phone, a communications device, a personal digital assistant (PDA), a tablet, a navigation device, a music player, a video player, or an entertainment unit.

The first MTJ device 104 may include a free layer (illustrated by a double arrow) and a pinned layer (illustrated by a single arrow). The first MTJ device 104 may be programmed to a parallel state (representative of a logical "0" data value) or to an anti-parallel state (representative of a logical "1" data value). In the parallel state, a polarization of the pinned layer of the first MTJ device 104 and a polarization of the free layer of the first MTJ device 104 has a similar orientation. In the anti-parallel state, the polarization of the pinned layer of the first MTJ device 104 and the polarization of the free layer of the first MTJ device 104 has an opposite orientation. The first MTJ device 104 may have a relatively low resistance (e.g., approximately between 2000 ohms and 4000 ohms) in the parallel state, and the first MTJ device 104 may have a relatively high resistance (e.g., approximately between 4000 ohms and 8000 ohms) in the anti-parallel state.

The second MTJ device 108 may also include a free layer (illustrated by a double arrow) and a pinned layer (illustrated by a single arrow). The second MTJ device 108 may be programmed to a parallel state (representative of a logical "0" data value) or to an anti-parallel state (representative of a logical "1" data value). In the parallel state, a polarization of the pinned layer of the second MTJ device 108 and a polarization of the free layer of the second MTJ device 108 has a similar orientation. In the anti-parallel state, the polarization of the pinned layer of the second MTJ device 108 and the polarization of the free layer of the second MTJ device 108 has an opposite orientation. The second MTJ device 108 may have a relatively low resistance (e.g., approximately between 2000 ohms and 4000 ohms) in the parallel state, and the second MTJ device 108 may have a relatively high resistance (e.g., approximately between 4000 ohms and 8000 ohms) in the anti-parallel state.

Because the MTJ devices 104, 108 are included in a complementary bit cell (e.g., the complementary bit cell 100), the state of the first MTJ device 104 is opposite of the state of the second MTJ device 108. For example, if the first MTJ device 104 is programmed to the parallel state, then the second MTJ device 108 is programmed to the anti-parallel state. As another example, if the first MTJ device 104 is programmed to the anti-parallel state, then the second MTJ device 108 is programmed to the parallel state.

Although the MTJ devices 104, 108 depicted in FIG. 1 have a perpendicular magnetic orientation, the concepts described herein may also be applicable to MTJ devices having an "in-plane" orientation. Additionally, the concepts described herein may be applicable for MTJ devices having different MTJ device layer sequences. As a non-limiting example, the concepts may be applicable in scenarios where the free layer is above the pinned layer, or vice versa.

A first terminal (e.g., a source) of the first access transistor 102 may be coupled to a first source line (SL1), and a second terminal (e.g., a drain) of the first access transistor 102 may be coupled to the free layer of the first MTJ device 104. In a particular aspect, the first access transistor 102 is an n-type metal oxide semiconductor (NMOS) transistor. A gate terminal of the first access transistor 102 may be coupled to a word line (WL), and the pinned layer of the first MTJ device 104 may be coupled to a bit line (BL). Coupling the first access transistor 102 to the free layer of the first MTJ device 104 may be referred to as a "normal connection".

Although the second terminal of the first access transistor 102 is illustrated as being directly coupled to the free layer of the first MTJ device 104, in other aspects, the first MTJ device 104 may include additional layers (e.g., one or more capping layers and/or a "top" electrode) above the free layer, and the second terminal of the first access transistor 102 may be coupled to one of the additional layers. Similarly, although the bit line (BL) is illustrated as being directly coupled to the pinned layer of the first MTJ device 104, in other aspects, the first MTJ device 104 may include additional layers (e.g., one or more pinning layers and/or a "bottom" electrode) below the pinned layer, and the bit line (BL) may be coupled to one of the additional layers. Thus, a "normal connection" as described herein may refer to a scenario where an access transistor is coupled to the free layer (or any layer "above" the free layer).

A first terminal (e.g., a source) of the second access transistor 106 may be coupled to a second source line (SL2), and a second terminal (e.g., a drain) of the second access transistor 106 may be coupled to the pinned layer of the second MTJ device 108. In a particular aspect, the second access transistor 106 is an NMOS transistor. A gate terminal of the second access transistor 106 may be coupled to the word line (WL), and the free layer of the second MTJ device 108 may be coupled to the bit line (BL). Coupling the second access transistor 106 to the pinned layer of the second MTJ device 108 may be referred to as a "reverse connection".

Although the second terminal of the second access transistor 106 is illustrated as being directly coupled to the pinned layer of the second MTJ device 108, in other aspects, the second MTJ device 108 may include additional layers (e.g., one or more pinning layers and/or a "bottom" electrode) below the pinned layer, and the second terminal of the second access transistor 106 may be coupled to one of the additional layers. Similarly, although the bit line (BL) is illustrated as being directly coupled to the free layer of the second MTJ device 108, in other aspects, the second MTJ device 108 may include additional layers (e.g., one or more capping layers and/or a "top" electrode) above the free layer, and the bit line (BL) may be coupled to one of the additional layers. Thus, a "reverse connection" as described herein may refer to a scenario where an access transistor is coupled to the pinned layer (or any layer "below" the pinned layer).

The complementary bit cell 100 of FIG. 1 utilizes a shared bit line (BL) to reduce routing area and to reduce the amount of metal traces (e.g., reduce a metal trace associated with a bit line "bar") compared to a traditional 2T2MTJ complementary bit cell. Reducing the number of metal traces makes the complementary bit cell 100 more compact (e.g., may make the complementary bit cell 100 a "high density cell" and/or may reduce the size of the complementary bit cell 100 compared to a traditional 2T2MTJ complementary bit cell).

Reducing the number of metal traces may also reduce an amount of parasitic resistance present in a complementary bit cell (e.g., the complementary bit cell 100) compared to a traditional 2T2MTJ complementary bit cell having a bit line and a bit line "bar". For example, additional metal traces (e.g., the bit line "bar") may add parasitic resistance which may degrade performance (e.g., decrease a tunneling magneto-resistive (TMR) effect and increase switching voltages for MTJ devices). Thus, sharing the bit line (BL) between the MTJ devices 104, 108 may increase TMR and reduce switching voltages for the MTJ devices 104, 108 (as compared to a traditional 2T2MTJ complementary bit cell). As described below, the shared bit line (BL) may also enable differential sensing at relatively high speeds and may enable each MTJ device 104, 106 to be programmed and sensed (e.g., read) at the same time (e.g., concurrently).

Figure 2:
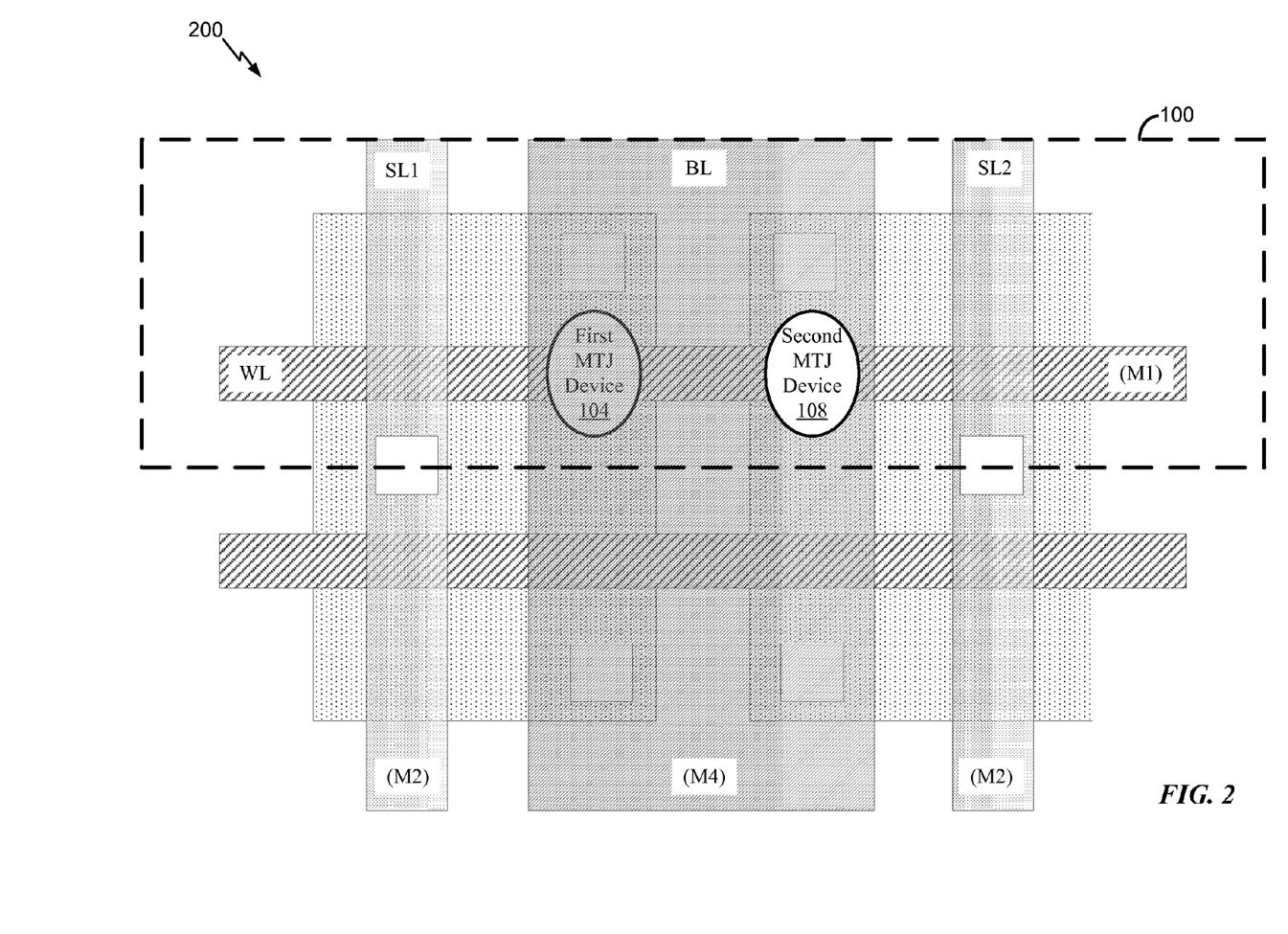
FIG. 2 is a diagram of a particular illustrative aspect of a topology of the complementary bit cell of FIG. 1.

FIG. 2 is a particular illustrative aspect of a topology 200 of the complementary bit cell 100 of FIG. 1. According to the topology, the first word line (WL) may be located in a first metal layer (M1) and the source lines (SL1, SL2) may be located in a second metal layer (M2). The bit line (BL) may be located in a fourth metal layer (M4).

In FIG. 2, the first MTJ device 104 and the second MTJ device 108 may be located in different layers. For example, the first MTJ device 104 may be located between a third metal layer (M3) (not shown) and the fourth metal layer (M4), and the second MTJ device may be located between the fourth metal layer (M4) and a fifth metal layer (M5) (not shown). Thus, the bit line (BL) in the fourth metal layer (M4) may be coupled to the first MTJ device 104 and to the second MTJ device 108.

The topology 200 of FIG. 2 may reduce MTJ density in a single layer by placing the first MTJ device 104 and the second MTJ device 108 in different layers of the bit cell 100. For example, as MTJ etching becomes increasing difficult for smaller technologies (e.g., sub-30 nanometer (nm) technologies), the topology 200 may reduce MTJ density in one layer and increase a pitch associated with the MTJ devices 104, 108. Reducing the MTJ density (by placing the MTJ devices 104, 108 in separate layers) and increasing the pitch may relax etching constraints associated with the MTJ devices 104, 108. Placing the MTJ devices 104, 108 in separate layers may also make the complementary bit cell 100 more compact.

Although the topology 200 depicts the MTJ devices 104, 108 in separate layers, the MTJ devices 104, 108 may alternatively be located in the same layer and may achieve similar area savings benefits as described with respect to FIG. 1. For example, each MTJ device 104, 108 may be located between the third metal layer (M3) and the fourth metal layer (M4).

Figure 3:
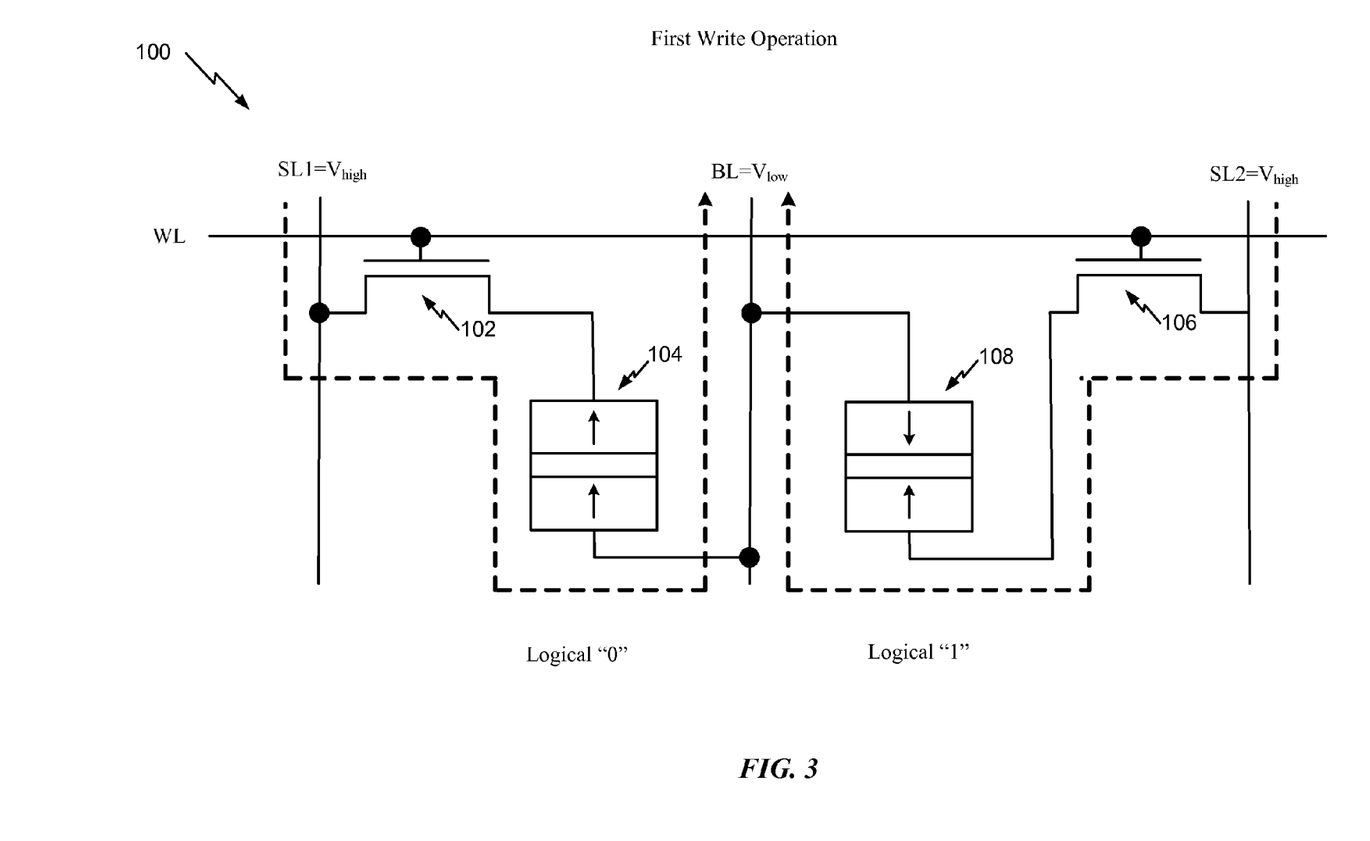
FIG. 3 is a diagram illustrating a first write operation for the complementary bit cell of FIG. 1.

Referring to FIG. 3, a particular illustrative example of a first write operation for the complementary bit cell 100 of FIG. 1 is shown. According to the example of FIG. 3, the first MTJ device 104 is programmed to a parallel state (e.g., representative of a logical "0" data value) and the second MTJ device 108 is programmed to an anti-parallel state (e.g., representative of a logical "1" data value).

To program the first MTJ device 104 to the parallel state, the first source line (SL1) is biased to a logical high voltage level ($V_{high}$) (e.g., a write voltage) and the bit line (BL) is biased to a logical low voltage level ($V_{low}$) (e.g., ground). A first write current (illustrated by a dotted line) may propagate from high potential to low potential based on the source line/bit line biasing. For example, the first write current may propagate from the first source line (SL1) through the first access transistor 102 to the free layer of the first MTJ device 104, and the first write current may propagate through the first MTJ device 104 to bit line (BL). The first write current may change the polarization of the free layer of the first MTJ device 104 to be parallel to the polarization of the pinned layer of the first MTJ device 104. Thus, the first write current may program the first MTJ device 104 to the parallel state.

To program the second MTJ device 108 to the anti-parallel state, the second source line (SL2) is biased to a logical high voltage level ($V_{high}$) (e.g., a write voltage) and the bit line (BL) is biased to the logical low voltage level ($V_{low}$) (e.g., ground). In a particular aspect, the source lines (SL1, SL2) may be biased at the same voltage level. In another aspect, the source lines (SL1, SL2) may be biased at different voltage levels. A second write current (illustrated by a dotted line) may also propagate from high potential to low potential based on the source line/bit line biasing. For example, the second write current may propagate from the second source line (SL2) through the second access transistor 106 to the pinned layer of the second MTJ device 108, and the second write current may propagate through the second MTJ device 108 to the bit line (BL). The second write current may change the polarization of the free layer of the second MTJ device 108 to be anti-parallel to the polarization of the pinned layer of the second MTJ device 108. Thus, the second write current may program the second MTJ device to 108 to the anti-parallel state.

The first write operation described with respect to FIG. 3 may support the single bit line (BL) architecture of the complementary bit cell 100. For example, a single bit line (BL) may be biased to program the first MTJ device 104 to the parallel state and the second MTJ device 108 to the anti-parallel state, as opposed to biasing two bit lines (e.g., a bit line and a bit line "bar") in a traditional 2T2MTJ complementary bit cell.

Figure 4:
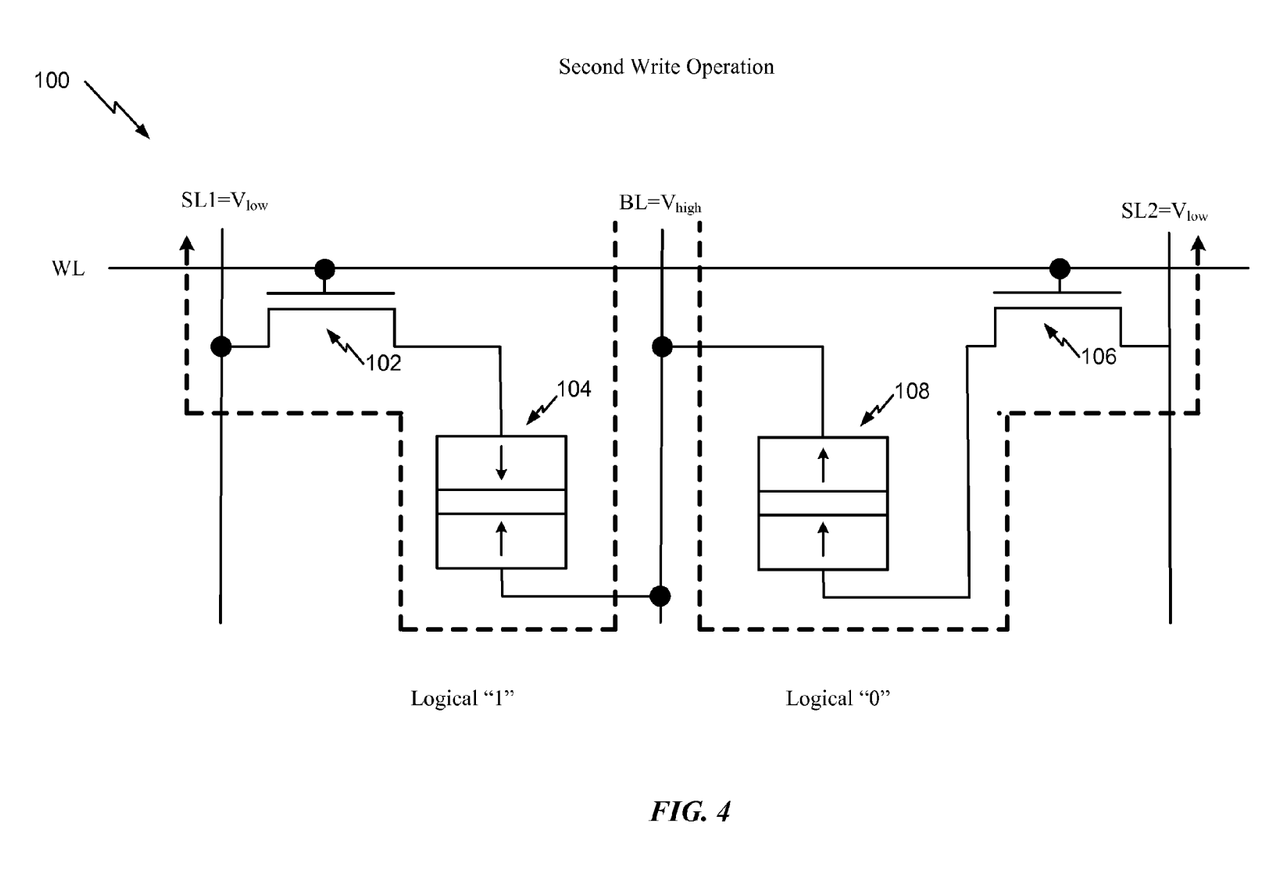
FIG. 4 is a diagram illustrating a first write operation for the complementary bit cell of FIG. 1.

Referring to FIG. 4, a particular illustrative example of a second write operation for the complementary bit cell 100 of FIG. 1 is shown. According to the example of FIG. 4, the first MTJ device 104 is programmed to an anti-parallel state (e.g., representative of a logical "1" data value) and the second MTJ device 108 is programmed to a parallel state (e.g., representative of a logical "0" data value).

To program the first MTJ device 104 to the anti-parallel state, the first source line (SL1) is biased to a logical low voltage level ($V_{low}$) (e.g., ground) and the bit line (BL) is biased to a logical high voltage level ($V_{high}$) (e.g., a write voltage). A first write current (illustrated by a dotted line) may propagate from high potential to low potential based on the source line/bit line biasing. For example, the first write current may propagate from the bit line (BL) to the pinned layer of the first MTJ device 104, and the first write current may propagate through the first MTJ device 104 and through the first access transistor 102 to the first source line (SL1). The first write current may change the polarization of the free layer of the first MTJ device 104 to be anti-parallel to the polarization of the pinned layer of the first MTJ device 104. Thus, the first write current may program the first MTJ device 104 to the anti-parallel state.

To program the second MTJ device 108 to the parallel state, the second source line (SL2) is biased to a logical low voltage level ($V_{low}$) (e.g., ground) and the bit line (BL) is biased to the logical high voltage level ($V_{high}$). A second write current (illustrated by a dotted line) may also propagate from high potential to low potential based on the source line/bit line biasing. For example, the second write current may propagate from the bit line (BL) to the free layer of the second MTJ device 108, and the second write current may propagate through the second MTJ device 108 and through the second access transistor 106 to the second source line (SL2). The second write current may change the polarization of the free layer of the second MTJ device 108 to be parallel to the polarization of the pinned layer of the second MTJ device 108. Thus, the second write current may program the second MTJ device 108 to the parallel state.

The second write operation described with respect to FIG. 4 may support the single bit line (BL) architecture of the complementary bit cell 100. For example, a single bit line (BL) may be biased to program the first MTJ device 104 to the anti-parallel state and the second MTJ device 108 to the parallel state, as opposed to biasing two bit lines (e.g., a bit line and a bit line "bar") in a traditional 2T2MTJ complementary bit cell.

Figure 5:
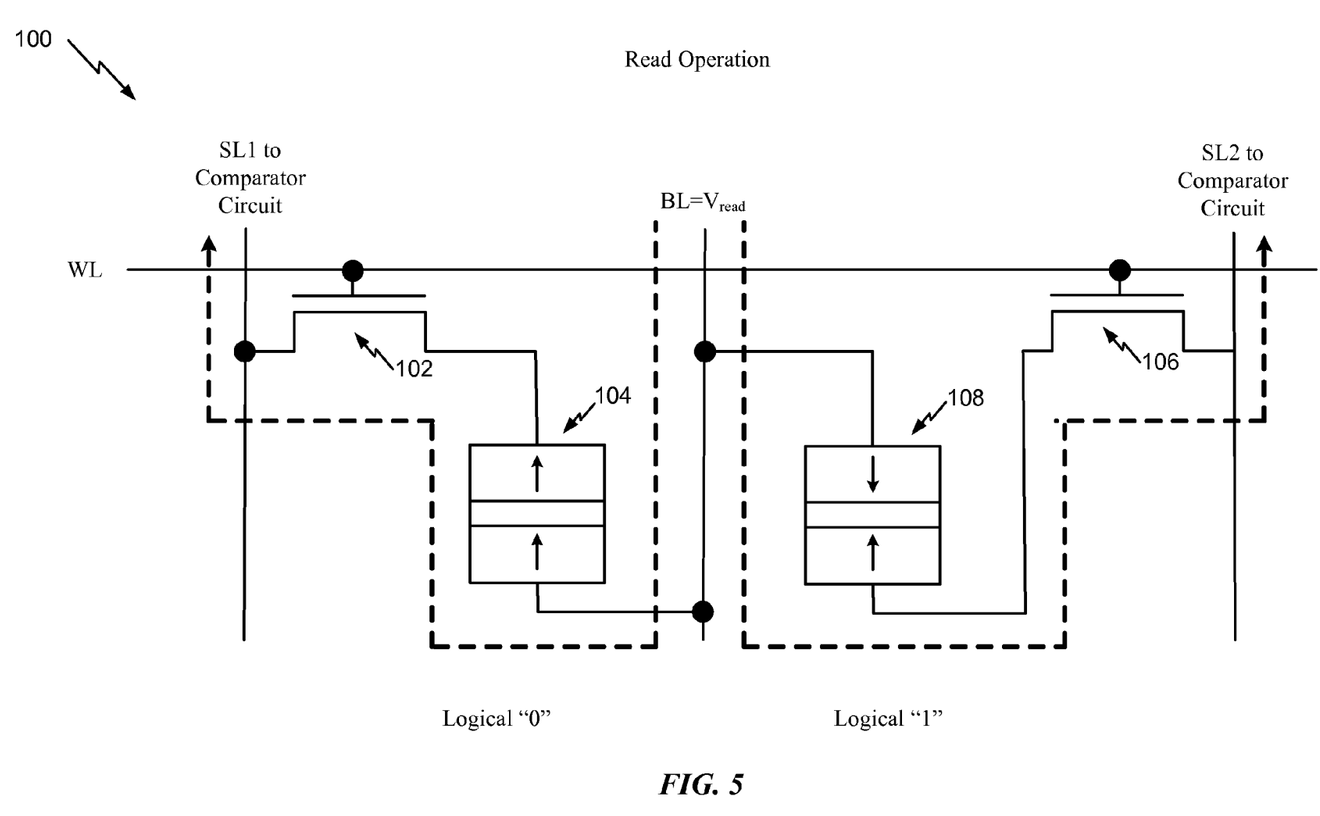
FIG. 5 is a diagram illustrating a read operation for the complementary bit cell of FIG. 1.

Referring to FIG. 5, a particular illustrative example of a read operation for the complementary bit cell 100 of FIG. 1 is shown. According to the example of FIG. 5, the first MTJ device 104 is programmed to a parallel state (e.g., representative of a logical "0" data value) and the second MTJ device 108 is programmed to an anti-parallel state (e.g., representative of a logical "1" data value).

To perform the read operation, the first source line (SL1) is coupled to one terminal of a comparator circuit (not shown) and the second source line (SL2) is coupled to another terminal of the comparator circuit. The comparator circuit may be included in a sensing amplifier (not shown). The bit line (BL) may be biased by a read voltage ($V_{read}$). In a particular aspect, the read voltage ($V_{read}$) is smaller than the write voltage as to create a read current (illustrated by the dotted line) that is large enough to enable differential sensing (as described below), but not too large to change the polarization of the free layers in the MTJ devices 104, 108 (e.g., the read voltage ($V_{read}$) is not as large as the write voltage described with respect to FIGS. 3-4).

When the bit line (BL) is biased by the read voltage ($V_{read}$), a first read current may propagate from the bit line (BL) to the pinned layer of the first MTJ device 104, and may propagate through the first MTJ device 104 and through the first access transistor 102 to the first source line (SL1). Additionally, a second read current may propagate from the bit line (BL) to the free layer of the second MTJ device 108, and may propagate through the second MTJ device 108 and through the second access transistor 106 to the second source line (SL2). The comparator circuit may perform a differential sensing operation to compare a voltage at the first source line (SL1) to a voltage at the second source line (SL2) if the read current on the first source line (SL1) and the read current on the second source line (SL2) are substantially equal as controlled by the sensing circuitry. Because the first read current is approximately equal to the second read current, the voltage comparison of the source lines (SL1, SL2) may be based, in large part, on the resistances of the MTJ devices 104, 108, respectively. For example, if the first MTJ device 104 is programmed to the parallel state and the second MTJ device 108 is programmed to the anti-parallel state (as illustrated in FIG. 5), the first MTJ device 104 may have a relatively small resistance and the second MTJ device 108 may have a relatively large resistance. Thus, the voltage drop across the first MTJ device 104 may be smaller than the voltage drop across the second MTJ device 108. As a result, the voltage at the first source line (SL1) may be greater than the voltage at the second source line (SL2).

The comparator circuit may perform differential sensing to determine a state (e.g., the representative data value) of each MTJ device 104, 108. For example, the comparator circuit may compare the voltage at the first source line (SL1) to the voltage at the second source line (SL2). If the voltage at the first source line (SL1) is greater than the voltage at the second source line (SL2), then the comparator circuit may determine that the first MTJ device 104 is programmed to the parallel state (e.g., representative of a logical "0" data value) and the second MTJ device 108 is programmed to the anti-parallel state (e.g., representative of a logical "1" data value). This scenario is illustrated in FIG. 5. Alternatively, if the voltage at the first source line (SL1) is less than the voltage at the second source line (SL2), then the comparator circuit may determine that the first MTJ device 104 is programmed to the anti-parallel sate (e.g., representative of a logical "1" data value) and the second MTJ device 108 is programmed to the parallel state (e.g., representative of a logical "0" data value).

The read operation described with respect to FIG. 5 (e.g., the differential sensing operation) may improve (e.g., increase) sensing speed compared to a sensing speed associated with a traditional 2T2MTJ complementary bit cell. For example, comparing the voltages at the source lines (SL1, SL2) to determine the states (and thus the representative logical data values) of each MTJ device 104, 108 may be faster than comparing the voltage at the first source line (SL1) to a reference voltage to determine the state of the first MTJ device 104 and comparing the voltage at the second source line (SL2) to the reference voltage to determine the state of the second MTJ device 108. The read operation may also improve (e.g., increase) a sensing window compared to a sensing window of a traditional 2T2MTJ complementary bit cell. For example, the voltage at the first source line (SL1) may be substantially different from the voltage at the second source line (SL2) to enable a relatively accurate reading with a large margin for error (e.g., relatively large read margin).

Figure 6:
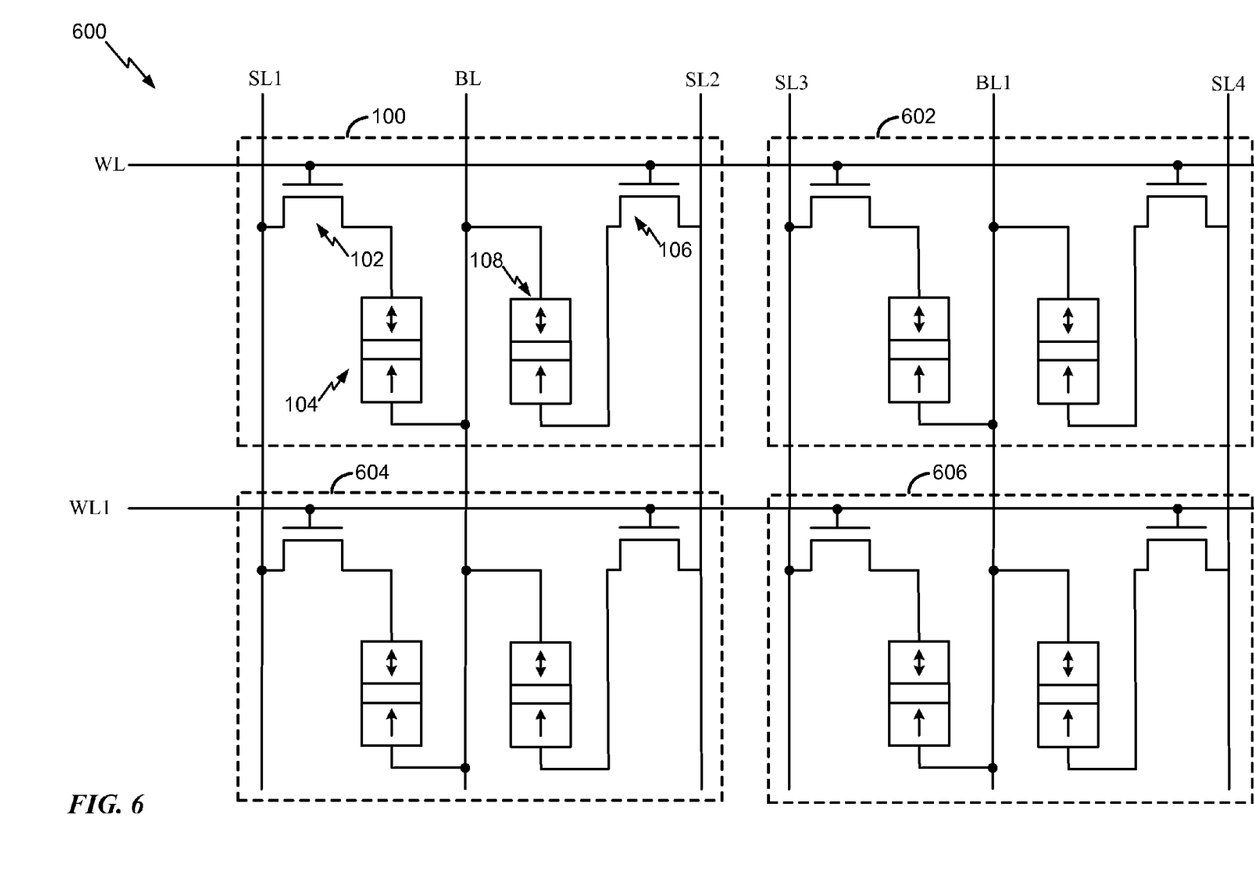
FIG. 6 is a diagram of a particular illustrative aspect of an array of complementary bit cells having shared bit lines.

Referring to FIG. 6, a particular illustrative example of an array 600 of complementary bit cells having shared bit lines is shown. In a particular aspect, the array 600 of complementary bit cells may include a STT-MRAM array. The array 600 of complementary bit cells includes the complementary bit cell 100 of FIG. 1, a complementary bit cell 602, a complementary bit cell 604, and a complementary bit cell 606. The array 600 of complementary bit cells may be integrated into a wireless device. For example, the array 600 of complementary bit cells may be integrated into a mobile phone, a communications device, a PDA, a tablet, a navigation device, a music player, a video player, or an entertainment unit.

Each complementary bit cell 602, 604, 606 may have a substantially similar architecture as the complementary bit cell 100. For example, each complementary bit cell 602, 604, 606 may include two access transistors and two MTJ devices (e.g., each complementary bit cell 602, 604, 606 may be a 2T2MTJ complementary bit cell). One access transistor-MTJ device pair in each complementary bit cell 602, 604, 606 may include a "normal connection" as described above, and another access transistor-MTJ device pair in each complementary bit cell 602, 604, 606 may include a "reverse connection" as described above. Additionally, each complementary bit cell 602, 604, 606 may include a single bit line (e.g., a shared bit line). For example, a pinned layer of one MTJ device in each complementary bit cell 602, 604, 606 may be coupled to a respective shared bit line, and a free layer of the other MTJ device in each complementary bit cell 602, 604, 606 may be coupled to the respective shared bit line.

To perform a read and/or write operation on a complementary cell 100, 602 in a first row of the array 600, the word line (WL) may be biased to a logical high voltage level and a word line (WL) may be biased to a logical low voltage level. The bit lines (BL, BL1) and the source lines (SL1, SL2, SL3, SL4) may be biased to select either the complementary bit cell 100 or the complementary bit cell 602. For example, to perform an operation on the bit cell 100, the bit line (BL1) and the source lines (SL3, SL4) may be biased to a logical low voltage level to reduce (e.g., prohibit) current flow in the complementary bit cell 602 (e.g., to "deselect" the complementary bit cell 602). To perform an operation on the bit cell 602, the bit line (BL) and the source lines (SL1, SL2) may be biased to a logical low voltage level to reduce current flow in the complementary bit cell 100.

To perform a read and/or write operation on a complementary cell 604, 606 in a second row of the array 600, the word line (WL) may be biased to a logical low voltage level and a word line (WL) may be biased to a logical high voltage level. The bit lines (BL, BL1) and the source lines (SL1, SL2, SL3, SL4) may be biased to select either the complementary bit cell 604 or the complementary bit cell 606. For example, to perform an operation on the bit cell 604, the bit line (BL1) and the source lines (SL3, SL4) may be biased to a logical low voltage level to reduce (e.g., prohibit) current flow in the complementary bit cell 606 (e.g., to "deselect" the complementary bit cell 606). To perform an operation on the bit cell 606, the bit line (BL) and the source lines (SL1, SL2) may be biased to a logical low voltage level to reduce current flow in the complementary bit cell 604.

Once a particular complementary bit cell 100, 602, 604, 606 is selected by biasing the word lines, source lines, and bit lines, as described above, the operations (e.g., the programming and sensing operations) of the selected complementary bit cell 100, 604, 604, 606 in the array 600 of complementary bit cells may function in a substantially similar manner as described with respect to FIGS. 3-5. For example, the shared bit line and the source lines in the selected complementary bit cell 100, 604, 604, 606 may be biased according to the techniques in FIGS. 3-5 to perform the programming and sensing operations.

Although the examples described above teach selecting one complementary bit cell at a time to perform a read or write operation, in other aspects, read operations (or write operations) may be performed at complementary bit cells in the same row of the array 600 at the same time. As a non-limiting example, to perform read operations for the complementary bit cells 100, 602 at the same time, the word line (WL) may be biased at to a logical high voltage level and the source lines (SL1, SL2, SL3, SL4) and the bit lines (BL, BL1) may be biased according to the techniques described with respect to FIGS. 3-5.

The array 600 of complementary bit cells in FIG. 6 may utilize shared bit lines to reduce routing area and reduce the amount of metal traces (e.g., reduce a metal trace associated with a bit line "bar") compared to traditional 2T2MTJ complementary bit cells. Reducing the number of metal traces may make the array 600 of complementary bit cells more compact.

Figure 7:
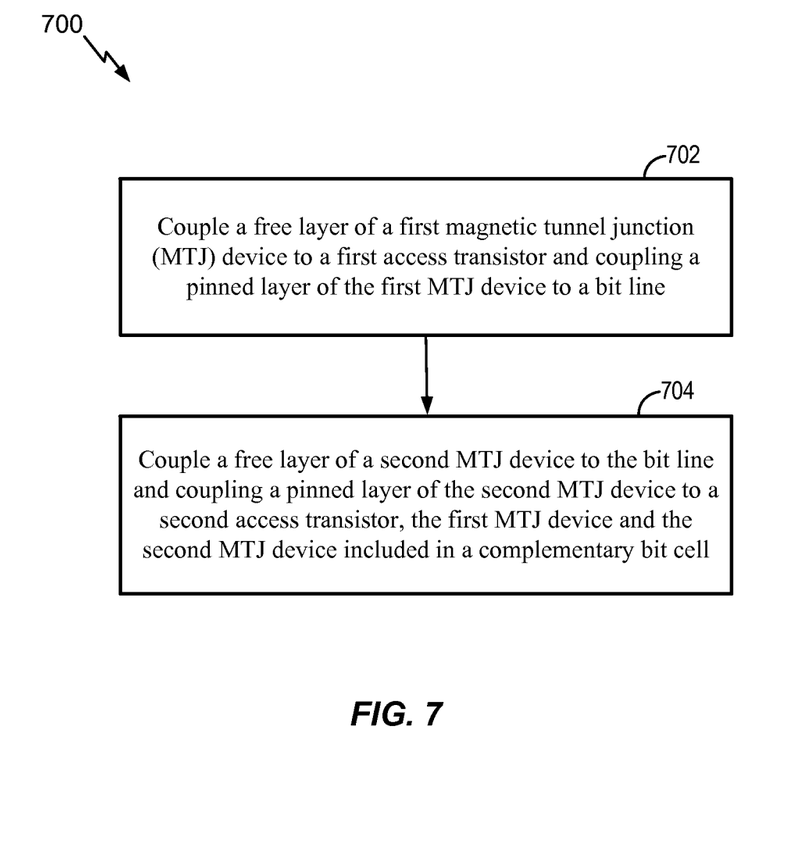
FIG. 7 is a flow chart of a particular illustrative aspect of a method for forming a complementary bit cell.

Referring to FIG. 7, a flowchart of a particular illustrative example of a method 700 for forming a complementary bit cell is shown. The method 700 may be performed using manufacturing equipment (e.g., fabrication equipment), such as the manufacturing equipment described with respect to FIG. 9.

The method 700 includes coupling a free layer of a first MTJ device to a first access transistor and coupling a pinned layer of the first MTJ device to a bit line, at 702. For example, referring to FIG. 1, the free layer of the first MTJ device 104 may be coupled to the first access transistor 102 and the pinned layer of the first MTJ device 104 may be coupled to the bit line (BL).

A free layer of a second MTJ device may be coupled to the bit line and a pinned layer of the second MTJ device may be coupled to a second access transistor, at 704. For example, referring to FIG. 1, the free layer of the second MTJ device 108 may be coupled to the bit line (BL) and the pinned layer of the second MTJ device 108 may be coupled to the second access transistor 106.

The method 700 of FIG. 7 may form a complementary bit cell that utilizes a shared bit line (BL) to reduce routing area and to reduce the amount of metal traces (e.g., reduce a metal trace associated with a bit line "bar") compared to a traditional 2T2MTJ complementary bit cell. Reducing the number of metal traces may make the complementary bit cell more compact (e.g., may make the complementary bit cell a "high density cell" and/or may reduce the size of the complementary bit cell compared to a traditional 2T2MTJ complementary bit cell). Reducing the number of metal traces may also reduce an amount of parasitic resistance present in a complementary bit cell compared to a traditional 2T2MTJ complementary bit cell having a bit line and a bit line "bar".

Figure 8:
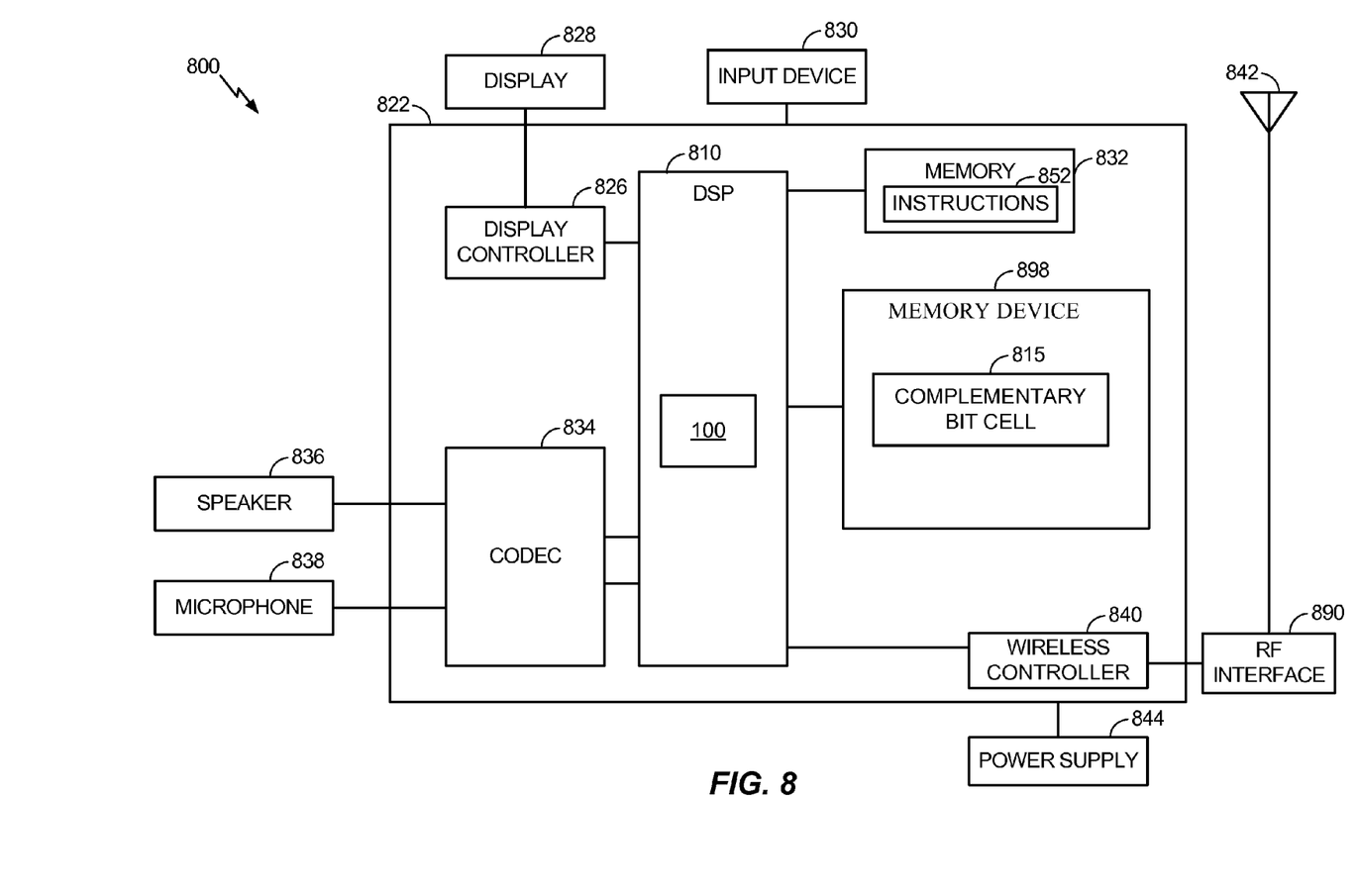
FIG. 8 is a block diagram of a device that includes the complementary bit cell of FIG. 1.

Referring to FIG. 8, a block diagram of a wireless device 800 including the complementary bit cell 100 having a shared bit line is shown. The wireless device 800 includes a processor 810, such as a digital signal processor (DSP), coupled to a memory 832. The memory 832 may be a non-transitory processor-readable storage medium that includes instructions 852. The processor 810 may include the complementary bit cell 100 of FIG. 1.

The wireless device 800 may also include a display controller 826 that is coupled to the processor 810 and to a display 828. A coder/decoder (CODEC) 834 can also be coupled to the processor 810. A speaker 836 and a microphone 838 can be coupled to the CODEC 834 and to the processor 810. FIG. 8 also indicates that a wireless controller 840 can be coupled to the processor 810. The wireless controller 840 may also be coupled to an antenna 842 via a radio frequency (RF) interface 890.

In a particular aspect, the processor 810, the display controller 826, the memory 832, the CODEC 834, and the wireless controller 840 are included in a system-in-package or system-on-chip device 822. In a particular aspect, an input device 830 and a power supply 844 are coupled to the system-on-chip device 822. Moreover, as illustrated in FIG. 8, the display 828, the input device 830, the speaker 836, the microphone 838, the antenna 842, and the power supply 844 are external to the system-on-chip device 822. However, each of the display 828, the input device 830, the speaker 836, the microphone 838, the antenna 842, and the power supply 844 can be coupled to a component of the system-on-chip device 822, such as an interface or a controller.

A memory device 898 (e.g., a STT-MRAM memory device) may also be coupled to the processor 810. The memory device 898 may include a complementary bit cell 815. The complementary bit cell 815 may have a similar configuration as the complementary bit cell 100. For example, the complementary bit cell 815 may be a 2T2MTJ complementary bit cell having a shared bit line. In particular implementations, other components of the wireless device 800 may include the complementary bit cells (e.g., 2T2MTJ complementary bit cells having a shared bit line), as described herein. For example, the display controller 826, the display 828, the input device 830, the CODEC 834, the speaker 836, the microphone 838, the wireless controller 840, or any combination thereof, may include the complementary bit cell 100.

In conjunction with the described aspects, an apparatus includes first means for storing a first data value, the first means for storing having a first free layer coupled to a first access transistor and having a first pinned layer coupled to a bit line. For example, the first means for storing may include the first MTJ device 104 of FIG. 1.

The apparatus also includes second means for storing a second data value, the second means for storing having a second free layer coupled to the bit line and having a second pinned layer coupled to a second access transistor. For example, the second means for storing may include the second MTJ device 108 of FIG. 1. The first means for storing and the second means for storing the second data value may be included in a complementary bit cell.

Figure 9:
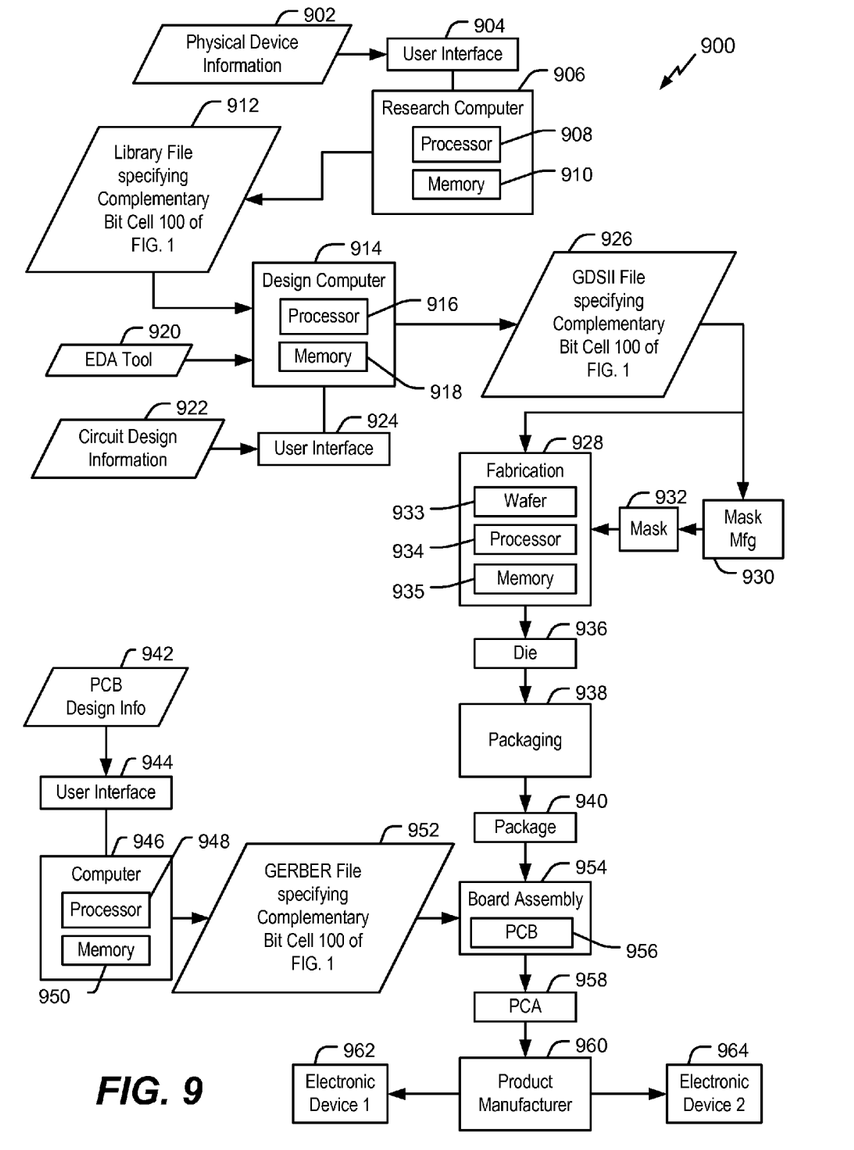
FIG. 9 is a data flow diagram of a particular illustrative aspect of a manufacturing process to manufacture the complementary bit cell of FIG. 1.

The foregoing disclosed devices and functionalities may be designed and configured into computer files (e.g., RTL, GDSII, GERBER, etc.) stored on computer-readable media. Some or all such files may be provided to fabrication handlers to fabricate devices based on such files. Resulting products include wafers that are then cut into dies and packaged into chips. The chips are then employed in devices described above. FIG. 9 depicts a particular illustrative aspect of an electronic device manufacturing process 900.

Physical device information 902 is received at the manufacturing process 900, such as at a research computer 906. The physical device information 902 may include design information representing at least one physical property of a semiconductor device, such as a physical property of the complementary bit cell 100 of FIG. 1. For example, the physical device information 902 may include physical parameters, material characteristics, and structure information that is entered via a user interface 904 coupled to the research computer 906. The research computer 906 includes a processor 908, such as one or more processing cores, coupled to a computer-readable medium such as a memory 910. The memory 910 may store computer-readable instructions that are executable to cause the processor 908 to transform the physical device information 902 to comply with a file format and to generate a library file 912.

In a particular aspect, the library file 912 includes at least one data file including the transformed design information. For example, the library file 912 may include a library of semiconductor devices, including the complementary bit cell 100 of FIG. 1, provided for use with an electronic design automation (EDA) tool 920.

The library file 912 may be used in conjunction with the EDA tool 920 at a design computer 914 including a processor 916, such as one or more processing cores, coupled to a memory 918. The EDA tool 920 may be stored as processor executable instructions at the memory 918 to enable a user of the design computer 914 to design a circuit including the complementary bit cell 100 of FIG. 1, using the library file 912. For example, a user of the design computer 914 may enter circuit design information 922 via a user interface 924 coupled to the design computer 914. The circuit design information 922 may include design information representing at least one physical property of a semiconductor device, such as the complementary bit cell 100 of FIG. 1. To illustrate, the circuit design property may include identification of particular circuits and relationships to other elements in a circuit design, positioning information, feature size information, interconnection information, or other information representing a physical property of an electronic device.

The design computer 914 may be configured to transform the design information, including the circuit design information 922, to comply with a file format. To illustrate, the file formation may include a database binary file format representing planar geometric shapes, text labels, and other information about a circuit layout in a hierarchical format, such as a Graphic Data System (GDSII) file format. The design computer 914 may be configured to generate a data file including the transformed design information, such as a GDSII file 926 that includes information describing the complementary bit cell 100 of FIG. 1, in addition to other circuits or information. To illustrate, the data file may include information corresponding to a system-on-chip (SOC) or a chip interposer component that that includes the complementary bit cell 100 of FIG. 1, and that also includes additional electronic circuits and components within the SOC.

The GDSII file 926 may be received at a fabrication process 928 to manufacture the complementary bit cell 100 of FIG. 1 according to transformed information in the GDSII file 926. For example, a device manufacture process may include providing the GDSII file 926 to a mask manufacturer 930 to create one or more masks, such as masks to be used with photolithography processing, illustrated in FIG. 9 as a representative mask 932. The mask 932 may be used during the fabrication process to generate one or more wafers 933, which may be tested and separated into dies, such as a representative die 936. The die 936 includes a circuit including the complementary bit cell 100 of FIG. 1.

In a particular aspect, the fabrication process 928 may be initiated by or controlled by a processor 934. The processor 934 may access a memory 935 that includes executable instructions such as computer-readable instructions or processor-readable instructions. The executable instructions may include one or more instructions that are executable by a computer, such as the processor 934.

The fabrication process 928 may be implemented by a fabrication system that is fully automated or partially automated. For example, the fabrication process 928 may be automated and may perform processing steps according to a schedule. The fabrication system may include fabrication equipment (e.g., processing tools) to perform one or more operations to form an electronic device. For example, the fabrication equipment may be configured to perform one or more of the processes described with reference to the method 700 of FIG. 7 using integrated circuit manufacturing processes (e.g., wet etching, chemical vapor etching, dry etching, deposition, chemical vapor deposition, planarization, lithography, in-situ baking, or a combination thereof).

The fabrication system may have a distributed architecture (e.g., a hierarchy). For example, the fabrication system may include one or more processors, such as the processor 934, one or more memories, such as the memory 935, and/or controllers that are distributed according to the distributed architecture. The distributed architecture may include a high-level processor that controls or initiates operations of one or more low-level systems. For example, a high-level portion of the fabrication process 928 may include one or more processors, such as the processor 934, and the low-level systems may each include or may be controlled by one or more corresponding controllers. A particular controller of a particular low-level system may receive one or more instructions (e.g., commands) from a high-level system, may issue sub-commands to subordinate modules or process tools, and may communicate status data back to the high-level system. Each of the one or more low-level systems may be associated with one or more corresponding pieces of fabrication equipment (e.g., processing tools). In a particular aspect, the fabrication system may include multiple processors that are distributed in the fabrication system. For example, a controller of a low-level system component of the fabrication system may include a processor, such as the processor 934.

In a particular aspect, the memory 935 may be a non-transitory computer-readable medium that includes data for enabling fabrication equipment (e.g., the fabrication system that implements the fabrication process 928) to form the complementary bit cell 100 of FIG. 1. The data, when used by the fabrication equipment, may cause the fabrication equipment to couple of the free layer of the first MTJ device 104 to the first access transistor 102 and couple of the pinned layer of the first MTJ device 104 to the bit line (BL). The data, when used by the fabrication equipment, may also cause the fabrication equipment to couple of the free layer of the second MTJ device 108 to the bit line (BL) and couple of the pinned layer of the second MTJ device 108 to the second access transistor 106.

Alternatively, the processor 934 may be a part of a high-level system, subsystem, or component of the fabrication system. In another aspect, the processor 934 includes distributed processing at various levels and components of a fabrication system.

The die 936 may be provided to a packaging process 938 where the die 936 is incorporated into a representative package 940. For example, the package 940 may include the single die 936 or multiple dies, such as a system-in-package (SiP) arrangement. The package 940 may be configured to conform to one or more standards or specifications, such as Joint Electron Device Engineering Council (JEDEC) standards.

Information regarding the package 940 may be distributed to various product designers, such as via a component library stored at a computer 946. The computer 946 may include a processor 948, such as one or more processing cores, coupled to a memory 950. A printed circuit board (PCB) tool may be stored as processor executable instructions at the memory 950 to process PCB design information 942 received from a user of the computer 946 via a user interface 944. The PCB design information 942 may include physical positioning information of a packaged electronic device on a circuit board, the packaged electronic device corresponding to the package 940 including the complementary bit cell 100 of FIG. 1.

The computer 946 may be configured to transform the PCB design information 942 to generate a data file, such as a GERBER file 952 with data that includes physical positioning information of a packaged electronic device on a circuit board, as well as layout of electrical connections such as traces and vias, where the packaged electronic device corresponds to the package 940 including the complementary bit cell 100 of FIG. 1. In other aspects, the data file generated by the transformed PCB design information may have a format other than a GERBER format.

The GERBER file 952 may be received at a board assembly process 954 and used to create PCBs, such as a representative PCB 956, manufactured in accordance with the design information stored within the GERBER file 952. For example, the GERBER file 952 may be uploaded to one or more machines to perform various steps of a PCB production process. The PCB 956 may be populated with electronic components including the package 940 to form a representative printed circuit assembly (PCA) 958.

The PCA 958 may be received at a product manufacturer 960 and integrated into one or more electronic devices, such as a first representative electronic device 962 and a second representative electronic device 964. As an illustrative, non-limiting example, the first representative electronic device 962, the second representative electronic device 964, or both, may be selected from a set top box, a music player, a video player, an entertainment unit, a navigation device, a communications device, a personal digital assistant (PDA), a fixed location data unit, and a computer, into which a semiconductor device described with reference to FIGS. 1-7 and 9, is integrated. As another illustrative, non-limiting example, one or more of the electronic devices 962 and 964 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 9 illustrates remote units according to teachings of the disclosure, the disclosure is not limited to these illustrated units. Aspects of the disclosure may be suitably employed in any device which includes active integrated circuitry including memory and on-chip circuitry.

A device that includes the complementary bit cell 100 of FIG. 1, may be fabricated, processed, and incorporated into an electronic device, as described in the illustrative manufacturing process 900. One or more aspects of the aspects disclosed with respect to FIGS. 1-6 may be included at various processing stages, such as within the library file 912, the GDSII file 926, and the GERBER file 952, as well as stored at the memory 910 of the research computer 906, the memory 918 of the design computer 914, the memory 950 of the computer 946, the memory of one or more other computers or processors (not shown) used at the various stages, such as at the board assembly process 954, and also incorporated into one or more other physical aspects such as the mask 932, the die 936, the package 940, the PCA 958, other products such as prototype circuits or devices (not shown), or any combination thereof. Although various representative stages are depicted with reference to FIGS. 1-6, in other aspects fewer stages may be used or additional stages may be included. Similarly, the process 900 of FIG. 9 may be performed by a single entity or by one or more entities performing various stages of the manufacturing process 900.

Those of skill would further appreciate that the various illustrative logical blocks, configurations, modules, circuits, and algorithm steps described in connection with the aspects disclosed herein may be implemented as electronic hardware, computer software, or combinations of both. Various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the aspects disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary non-transitory (e.g. tangible) storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal In the alternative, the processor and the storage medium may reside as discrete components in a computing device or user terminal The previous description of the disclosed aspects is provided to enable a person skilled in the art to make or use the disclosed aspects. Various modifications to these aspects will be readily apparent to those skilled in the art, and the principles defined herein may be applied to other aspects without departing from the scope of the disclosure. Thus, the present disclosure is not intended to be limited to the aspects shown herein but is to be accorded the widest scope possible consistent with the principles and novel features as defined by the following claims.

What is claimed is:

1. An apparatus comprising:
   a first magnetic tunnel junction (MTJ) device having a free layer coupled to a first access transistor and having a pinned layer coupled to a bit line; and
   a second MTJ device having a free layer coupled to the same bit line and having a pinned layer coupled to a second access transistor, the first MTJ device and the second MTJ device included in a complementary bit cell,
   wherein the first MTJ device and the second MTJ device are configured to store different bits of data.

2. The apparatus of claim 1, wherein the complementary bit cell is included in a spin-transfer torque magnetic random access memory (STT-MRAM) device.

3. The apparatus of claim 1, further comprising:
   a first source line coupled to the first access transistor; and
   a second source line coupled to the second access transistor.

4. The apparatus of claim 1, wherein the first access transistor and the second access transistor are n-type metal oxide semiconductor (NMOS) transistors.

5. The apparatus of claim 1, further comprising an array of complementary bit cells, each complementary bit cell in the array of complementary bit cells including two MTJ devices coupled to a common bit line.

6. The apparatus of claim 5, wherein the complementary bit cell is included in the array of complementary bit cells.

7. The apparatus of claim 1, wherein the first MTJ device and the second MTJ device are configured to be programmed concurrently.

8. The apparatus of claim 1, further comprising a sensing amplifier configured to concurrently sense a data value of the first MTJ device and a data value of the second MTJ device.

9. The apparatus of claim 1, wherein the first MTJ device and the second MTJ device are located in different layers of the complementary bit cell.

10. The apparatus of claim 1, wherein the complementary bit cell is integrated into a mobile phone, a communications device, a personal digital assistant (PDA), a tablet, a navigation device, a music player, a video player, or an entertainment unit.

11. An apparatus comprising:
    first means for storing a first data value, the first means for storing having a first free layer coupled to a first access transistor and having a first pinned layer coupled to a bit line; and
    second means for storing a second data value, the second means for storing having a second free layer coupled to the same bit line and having a second pinned layer coupled to a second access transistor, the first means for storing and the second means for storing included in a complementary bit cell.

12. The apparatus of claim 11, wherein the complementary bit cell is included in a spin-transfer torque magnetic random access memory (STT-MRAM) device.

13. The apparatus of claim 11, wherein the first means for storing includes a first magnetic tunnel junction (MTJ) device, and wherein the second means for storing includes a second MTJ device.

14. The apparatus of claim 11, further comprising an array of complementary bit cells, wherein the first means for storing and the second means for storing are included in the array of complementary bit cells.

15. The apparatus of claim 11, wherein the first means for storing and the second means for storing are configured to be programmed concurrently.

16. The apparatus of claim 11, wherein the first means for storing and the second means for storing are located in different layers of the complementary bit cell.

* * * * *